United States Patent
Zhao et al.

(10) Patent No.: US 9,841,453 B2
(45) Date of Patent: Dec. 12, 2017

(54) MECHANICAL SELF-RESETTING SHORT-CIRCUIT FAULT INDICATOR

(71) Applicants: State Grid Corporation of China, Beijing (CN); State Grid Shanxi Electric Power Corporation Yuncheng Power, Yuncheng (CN); Shanxi Honganxiang Science and Technology Development Limited Company, Shenxi (CN)

(72) Inventors: Shuhai Zhao, Yuncheng (CN); Yunhong Cheng, Yuncheng (CN)

(73) Assignees: State Grid Corporation of China, Beijing (CN); State Grid Shanxi Electric Power Corporation Yuncheng Power, Yuncheng (CN); Shanxi Honganxiang Science and Technology Development Limited Company, Shenxi (CN)

( * ) Notice: Subject to any disclaimer, the term of this patent is extended or adjusted under 35 U.S.C. 154(b) by 166 days.

(21) Appl. No.: 14/940,732

(22) Filed: Nov. 13, 2015

(65) Prior Publication Data
US 2016/0209455 A1   Jul. 21, 2016

(51) Int. Cl.
*G01R 31/02* (2006.01)
*H01H 71/04* (2006.01)

(52) U.S. Cl.
CPC .......... *G01R 31/025* (2013.01); *H01H 71/04* (2013.01)

(58) Field of Classification Search
CPC .... G01R 19/145; G01R 19/15; G01R 19/155; G01R 31/02; G01R 31/024; G01R 31/025; G01R 31/08; H01H 71/00

USPC .......... 116/204; 324/133, 529, 543
See application file for complete search history.

(56) References Cited

U.S. PATENT DOCUMENTS

| | | | | |
|---|---|---|---|---|
| 3,863,145 A | * | 1/1975 | Kelly et al. | G01R 31/021 |
| | | | | 324/126 |
| 3,902,168 A | * | 8/1975 | Dola | G01R 19/16571 |
| | | | | 324/133 |
| 5,444,380 A | * | 8/1995 | Bourgeois et al. | G01R 31/085 |
| | | | | 324/127 |

FOREIGN PATENT DOCUMENTS

| | | | | |
|---|---|---|---|---|
| CN | 2059506 U | 7/1990 | | |
| CN | 2132997 Y | 5/1993 | | |
| CN | 2141571 Y | 9/1993 | | |
| CN | 2507017 Y | 8/2002 | | |
| CN | 2591630 Y | 12/2003 | | |
| DE | 3117204 A1 | * | 11/1982 | ....... G01R 19/16571 |
| DE | 3439940 A1 | * | 5/1986 | ............. G01R 19/15 |

(Continued)

*Primary Examiner* — R. A. Smith
(74) *Attorney, Agent, or Firm* — Gardere Wynne Sewell LLP; Andre M. Szuwalski (57) ABSTRACT

A mechanical fault indicator of the automatic reset includes the core, the dial, the lock, the indicating rods, and the shell. The core includes the clip-on core, fixed core, connecting core and movable iron core. The pointer includes the indicating axis of rotation, the pointer connection and the indicating rod. The lock includes the lock axis of rotation, the lock hook and balancing weight. When using the indicator, clip the wire of the transmission line into the two-part clip-on core. When a short circuit fault happens, the indicating rod falls out of the housing, of which the action indicates failure. When the circuit is back to normal, the indicating rod resets automatically. The indicator has the advantages of: low cost, long service life, purely mechanical, no circuit and battery, and the installation is simple and convenient.

5 Claims, 9 Drawing Sheets

(56) References Cited

FOREIGN PATENT DOCUMENTS

| GB | 695889 A | * | 8/1953 | ............. | G01R 19/15 |
| JP | 2006184244 A | * | 7/2006 | ............. | G01R 31/02 |
| SU | 1525630 A | * | 11/1989 | ............. | G01R 31/02 |

* cited by examiner

MECHANICAL SELF-RESETTING SHORT-CIRCUIT FAULT INDICATOR

PRIORITY CLAIM

This application is a Bypass Continuation application from PCT/CN2015/071243 filed Jan. 21, 2015, which claims priority from Chinese Application for Patent Application No. 201410308400.9 filed Jul. 1, 2014, the disclosures of which are hereby incorporated by reference.

TECHNICAL FIELD

This invention relates to a kind of transmission line fault indicator, specifically, related to a self-resetting mechanical short circuit fault indicator

TECHNICAL BACKGROUND

Nowadays there are generally two types of short circuit fault indicators. The first type is mechanical, such as disclosed in Chinese Patent CN2059506U; or alternatively, a short circuit fault indicator as published in CN2141571Y, indicating whether a branch line is a fault line. Either indicator type requires manual resetting, laboriously. Another type is electronic, such as disclosed in China's patent CN2132997Y, CN2507017Y, CN2591630Y for general short-circuit fault indicators, which rely on a spinning color piece controlled by an electronic circuit to indicate a status through the color change in a view window indicating when the short circuit fault happens. This electrical process requires a delay resetting. The electronic type not only costs higher, but also requires batteries that require frequent replacement, very troublesome. An alternative electronic type short-circuit fault indicator is supplied by rechargeable batteries receiving power from the grid, at a much higher cost while the life of the rechargeable battery is still very limited. Additionally, observing the color of the view window requires close observation, especially at night—this can impose substantial difficulties.

SUMMARY

This invention aims to overcome the shortcomings of current technology to provide a low cost, long life, pure mechanical, and self-recoverable fault indicator.

In order to solve the above technical problems, the technical scheme of the invention is a self-resetting mechanical short circuit fault indicator composed of the core, the dial, the lock, the indicating rod and the housing. The character of the indicator is: the core is composed of the clip-on core (3), the fixed core (9) and the connection core (7) and the movable core (8). The dial block (13), the fixed core (9) and the connection core (7) are fixed on the housing (6). The lock and the pointer through between the lock axis of rotation (18) and the pointer axis of rotation (16) are installed inside the housing (6). The tension spring (12) which is between the movable core (8) and the housing (6) is fixed on the fixed core (9) fixes compression spring (11).

The clip-on core (3) is the two symmetry components, the hinge (5) and the locking spring (4) are mounted on the clip-on core (3).

The pointer includes the indicating axis of rotation (16), the indicating connection (15) and the indicating rod (14).

The lock includes the lock axis of rotation (18), the lock hook (19) and balancing weight (17).

The described housing (6) is made of insulating material.

When using the indicator, clip the wire (1) of the transmission line into the two clip-on core (3), when a short circuit fault happens, the indicating rod from housing falls, the action indicates failure, when the circuit is back to normal, the indicating rod recover automatically.

The invention compared with the current technology has the following beneficial effects: this indicator can automatically recover after action, low cost, long service life, purely mechanical, no need for circuit and battery, the installation is simple and convenient.

BRIEF DESCRIPTION OF THE ATTACHED DRAWINGS

The disclosure will be better understood on reading the description which follows, given solely by way of example and with reference to the appended drawings in which.

FIGURE REFERENCE NUMERALS

1. The conductor;
2. The short circuit fault indicator of the automatic reset;
3. The clip-on core;
4. The lock spring;
5. The hinge;
6. The housing;
7. The connecting core;
8. The moving core;
9. The fixed core;
10. The rivet;
11. The compression spring;
12. The tension spring;
13. The dial block;
14. The indicating rod;
15. The indicating connection;
16. The indicating rod axis of rotation;
17. The balancing weight;
18. The lock axis of rotation;
19. The lock hook;
20. The axis of rotation of the moving core;
21. The tension spring link of the moving core;
22. The axis of rotation of the dial; and
23. The axis of rotation sleeve of the dial.

DETAILED DESCRIPTION

At a high level, a mechanical short circuit fault indicator uses magnetic fields generated at excessive high current during short circuit faults to actuate a magnetically sensitive piece to indicate the occurrence of such faults, so as to improve reliability and reduce costs and requirement for frequent maintenance. One example of the short circuit fault indicator is illustrated in FIGS. 1-12, as disclosed below.

Figure 1:
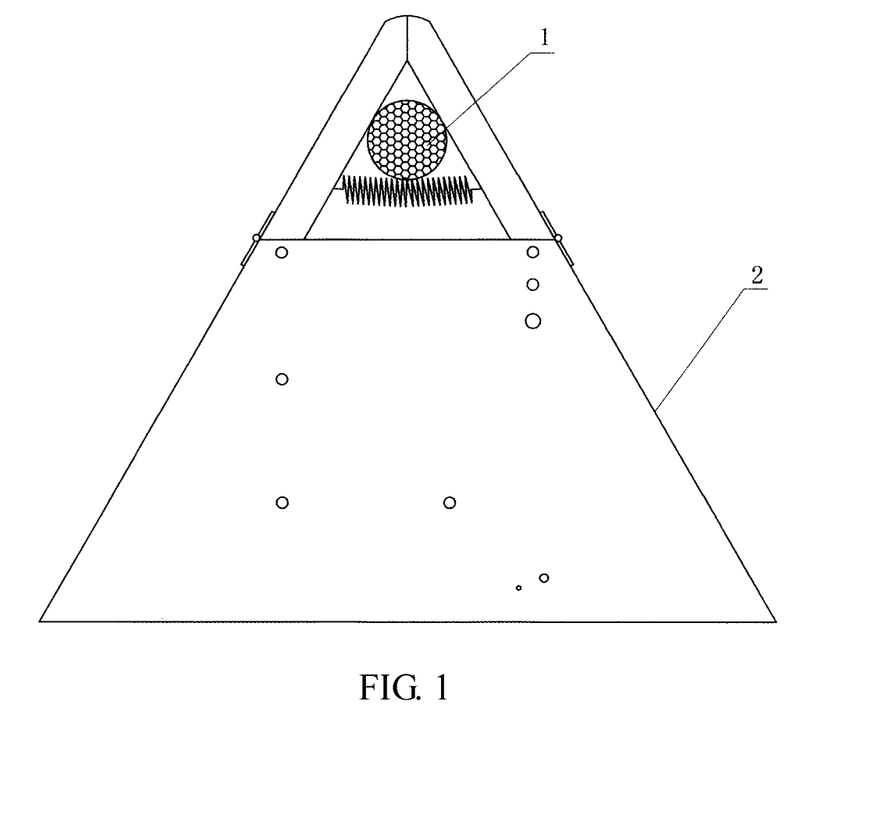
FIG. 1 is a front view of a short circuit fault indicator installed onto a transmission line.
Figure 2:
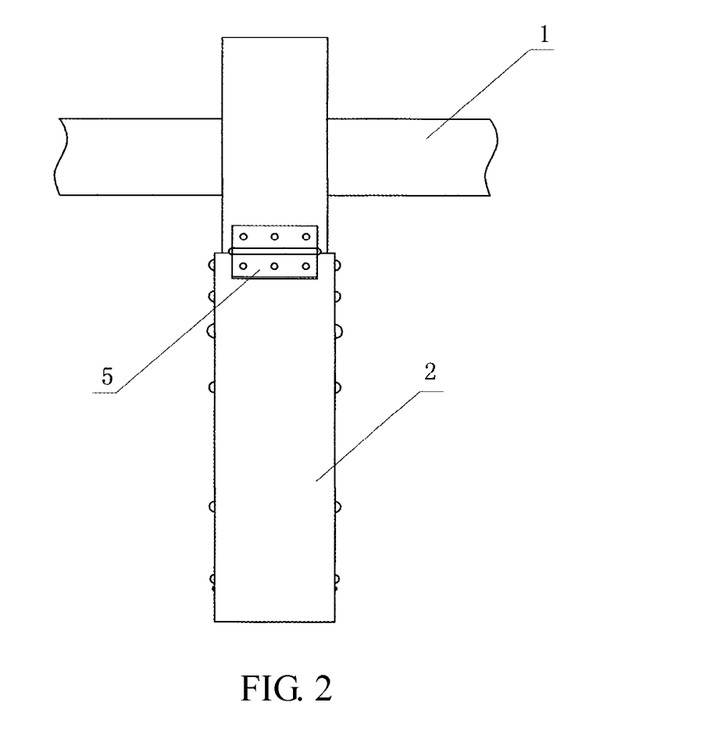
FIG. 2 is a side view of the short circuit fault indicator and the transmission line of FIG. 1.
Figure 3:
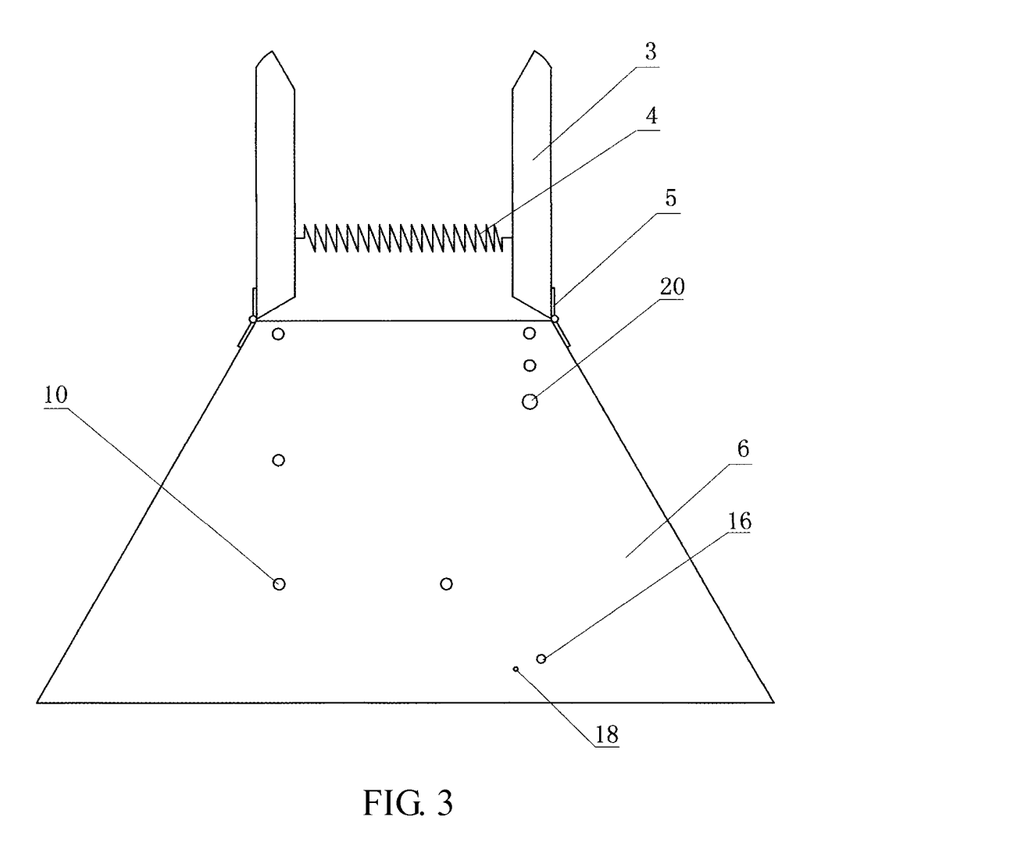
FIG. 3 is a front view of the short circuit fault indicator when the clip-on core is open for removal or installation.
Figure 4:
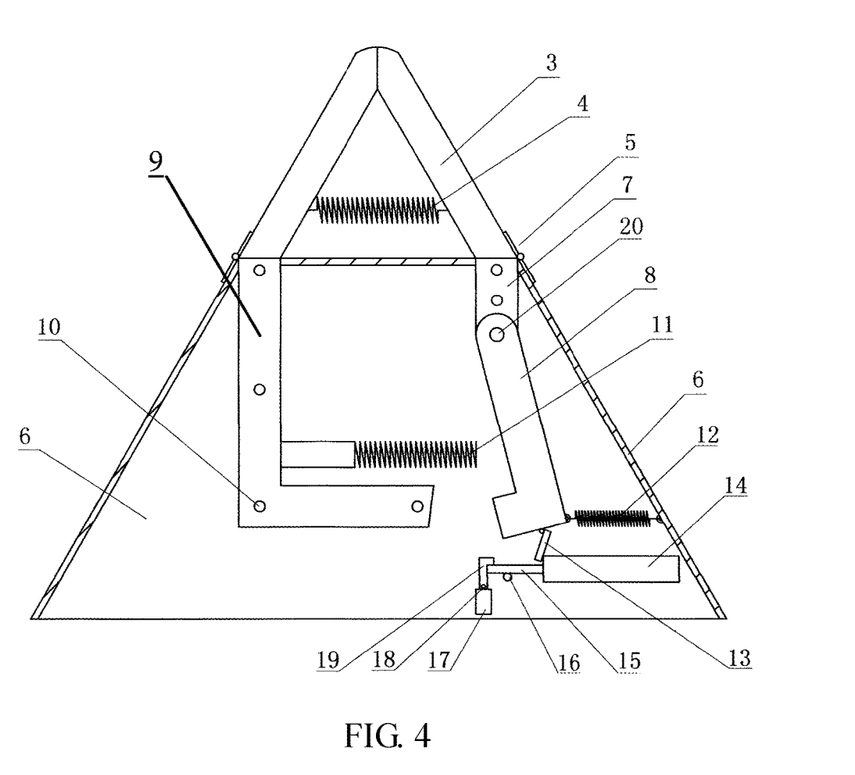
FIG. 4 is a front view of the short circuit fault indicator with part of housing cover removed, exposing inner components.

FIG. 1 is to connect the invention with the conductor view. FIG. 2 is left view of the FIG. 1. FIG. 3 is the opening state diagram of the clip-on core (3). The two clip-on cores mounted on the hinge (5), and can be charged disassembled. FIG. 4 is the internal institutions of invention and the state of normal power failure diagram. The invention is a mechanical fault indicator of the automatic reset composed of core, dial the piece, lock, indicating rods and housing. The core is made of magnetic materials, composed of the clip-on core (3), the fixed core (9), the connecting core (7) and the moving core (8). The moving core (8) and the fixed core (9) contact each other to form a closed magnetic circuit (e.g., in FIG. 6). The dial (13) on the moving core (8), the fixed core (9) and the connecting core (7) are fixed inside housing (6). The housing (6) has the lock axis of rotation (18) and the indicating rod axis of rotation (16). The axis of rotation of moving core (20) is the tension spring (12) between the moving core and the housing (6). The fixed core (9) is fixed to compression spring (11). When the conductor is without current, there is no magnetic inside the core. The tension spring (12) will pull the moving core (8) in the initial state, and the dial block (13) does not work in a random state.

Figure 5:
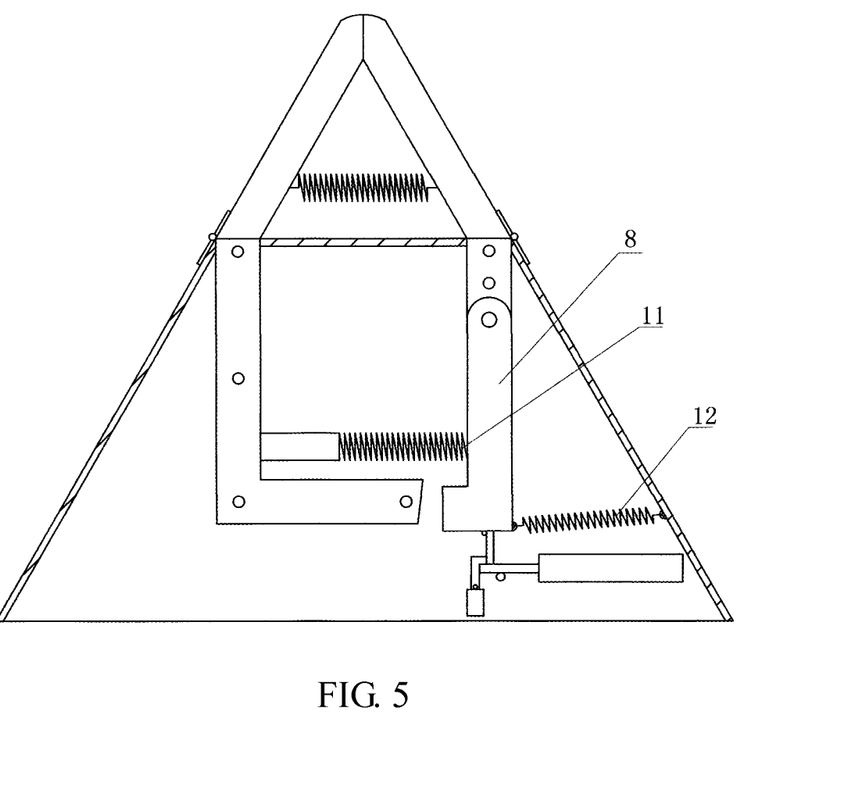
FIG. 5 illustrates the short circuit fault indicator operating under normal current levels.
Figure 6:
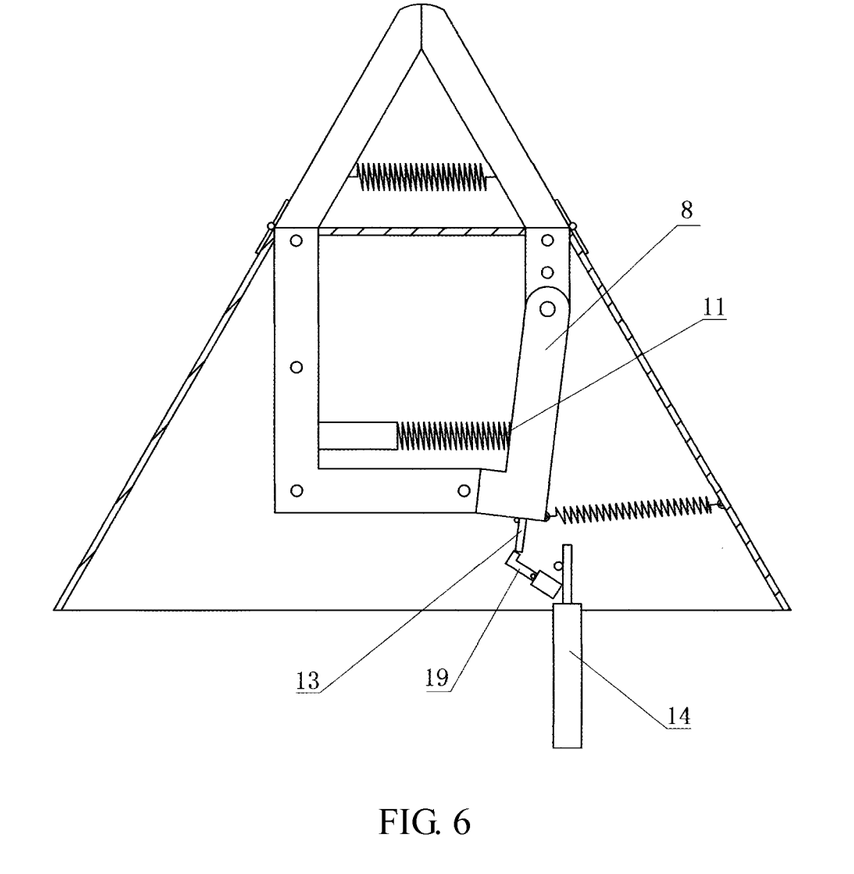
FIG. 6 illustrates the short circuit fault indicator showing an occurrence of a short circuit fault.
Figure 7:
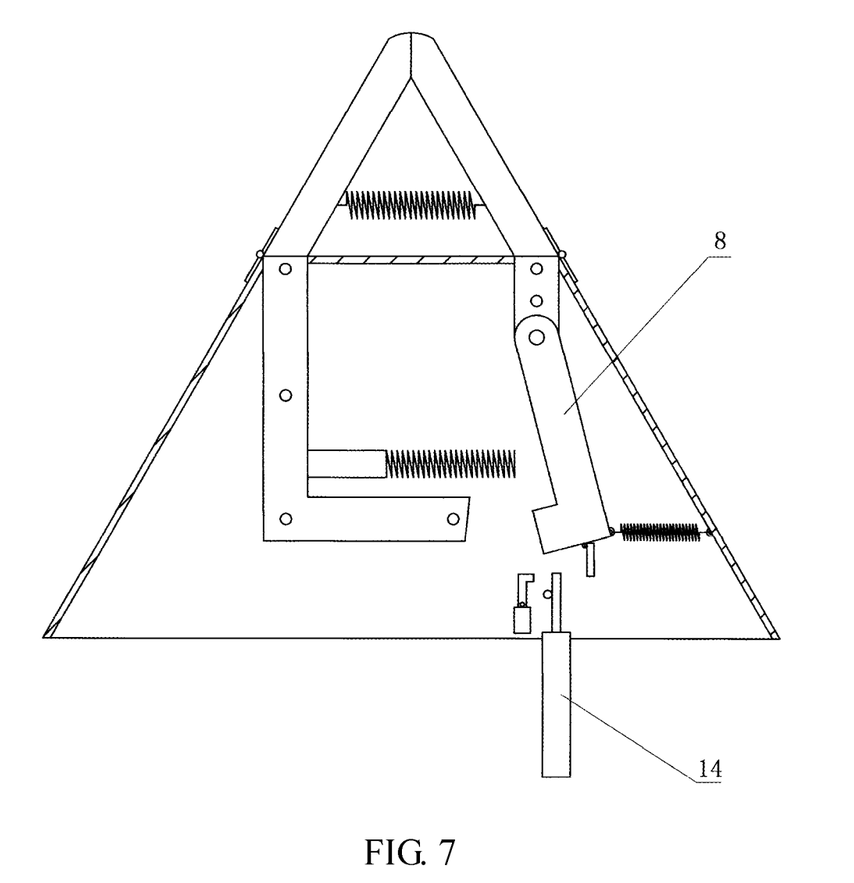
FIG. 7 illustrates the short circuit fault indicator in blackout periods when no current travels through the transmission line.

FIG. 5 illustrates the indicator (2) in a normal operation state, when the transmission line (1) has electrical current at normal levels. Inside the core assembly forms a magnetic induction, it pushes the moving core (8) to the fixed core (9) direction, when the moving core (8) contacts with the compression spring (11). When the compression spring (11) is stretched the magnetic attraction is formed by the normal current and there is not enough to compress the compression spring (11). The dial block (13) moves to the running state position and is blocked by the compression spring. FIG. 6 illustrates the indicator (2) in instantaneous short circuit fault occurring state, when the transmission line (1) short circuits, the electrical current level increases to thousands of amps, the core induct huge magnetic attraction, huge magnetic attraction makes the moving core (8) to compress compression spring (11), when the moving core (8) and the fixed core (9) contacted, the moving core (8) drives the dial block (13) to open the lock hook (19), indicating the rod fell from the housing, indicating failure. FIG. 7 illustrates the indicator (2) in the event of a fault caused by power blackouts in the blackouts state, patrol look up along the instructions fault feeder can find out fault feeder or short-circuit fault location. After processing the fault, the wire resetting the dial block (13) drives the indicating connection (15) fold, after being put back in place, then the lock hook (19) hooks it, restore to the normal operation of the attached FIG. 5 shows.

Figure 8:
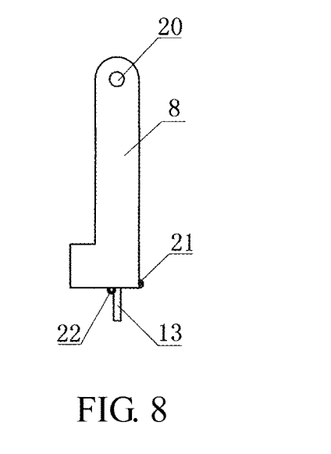
FIG. 8 shows a detailed front view of the movable core.
Figure 9:
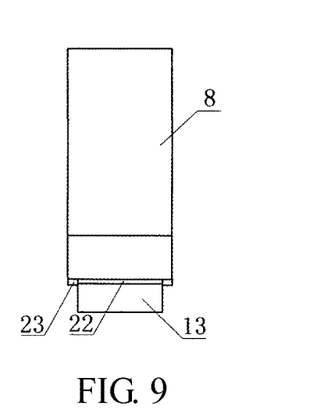
FIG. 9 shows a side view of the movable core of FIG. 8.
Figure 10:
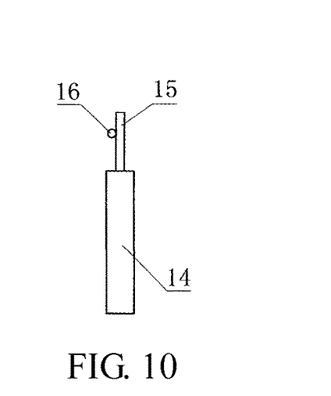
FIG. 10 shows a detailed front view of the indicating rod.
Figure 11:
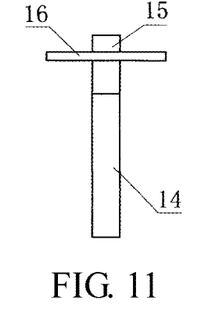
FIG. 11 shows a side view of the indicating rod of FIG. 10.
Figure 12:
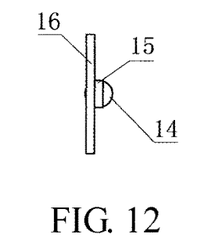
FIG. 12 shows a top view of the indicating rod of FIG. 10.
Figure 13:
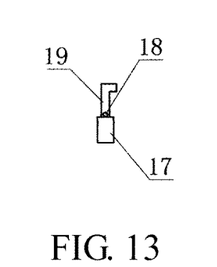
FIG. 13 shows a front view of the locking piece.
Figure 14:
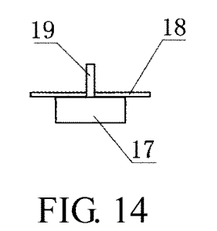
FIG. 14 shows a side view of the locking piece of FIG. 13.

FIGS. 8 to 13 illustrate the movable core 8, the indicator rod 14, and the locking piece 19 in more detail. FIG. 8 shows a detailed front view of the movable core 8. FIG. 9 shows a side view of the movable core 8. FIG. 10 shows a detailed front view of the indicating rod 14. FIG. 11 shows a side view of the indicating rod 14. FIG. 12 shows a top view of the indicating rod 14. FIG. 13 shows a front view of the locking piece 19. FIG. 14 shows a side view of the locking piece 19. In some embodiments, the pointer includes the indicating axis of rotation (16), the indicating connection (15) and the indicating rod (14), the indicating rod (14) can be a cylindrical type and can also be a prism. The indicating rod (14) is made of lightweight waterproof material, and can be adhesion of night reflective material on the surface of the indicating rod (14)

In some other embodiments, the locking piece includes the lock axis of rotation (18), the lock hook (19) and the balancing weight (17). The balancing weight (17) role is to make sure the lock hook (19) is always perpendicular to the ground. Housing (6) is made up of insulating material, the surface of the housing (6) can also be adhesion of night reflective material, the color adhered on the surface of the housing (6) and the indicating rod is separated.

To further explain the embodiments disclosed above, FIG. 5 illustrates the short circuit fault indicator (2) operating under normal current levels in the transmission line (1). The normal current levels generate a normal magnetic field around the core assembly such that the movable core (8) is attracted to the fixed core (9). The tension spring (12) and the compression spring (11) limit the distance between the movable core (8) and the fixed core (9). In the equilibrium position shown in FIG. 5, the dial block (13) is in contact with both the end of the indicating rod (14) and the locking piece (19). By comparison, FIG. 6 illustrates the short circuit fault indicator (2) showing an occurrence of a short circuit fault. The high currents occurred upon a short circuit fault causes an excessive magnetic field that actuates the movable core (8) toward the fixed core (9), overcoming the resistance provided by the springs (11) and (12). As the movable core (8) rotates around the connection core (7) and moves toward the fixed core (9), the locking piece (19) is forced to rotate around the axis (18), thus releasing the indicator rod (14). The indicator rod (14) rotates under gravity so that the indicating body appears outside the housing (6).

To further explain the recovery (e.g., resetting) mechanism, FIG. 7 illustrates the short circuit fault indicator (2) in black-out periods when no current travels through the transmission line 1. The movable core (8) is then pulled by the tension spring (12) to its default position. The tension spring (12) allows the dial block (13) to overcome the connection piece (15) when the dial block (13) passes over the indicator rod (14) as the movable core (8) moves to the default position. In the illustrated embodiment, the dial block (13) is limited in certain amount of rotation, for example, based on the normal position shown in FIG. 5. Only clockwise rotation is allowed and the counterclockwise rotation is limited. Thus, when the transmission line (1) returns to normal operation, the movable core (8) will be again attracted to the fixed core (9), and the dial block (13) will rotate the indicator rod (14) in the counterclockwise direction by engaging the connection piece (15). The lock piece (19) then engages the connection piece (15) and the short circuit fault indicator (2) is then automatically reset to the configuration shown in FIG. 5.

Combined with the appended drawings illustrates in detail the implementation example of the invention, but the invention is not limited to the above example, one skilled in the field of knowledge, can also base on the premise of not out of the present invention principle to make various changes, such as appearance shape can be other shapes such as triangle, hemicycle, and the changing position of the internal structure parts belong to the claims. For example, in the implementation illustrated in FIG. 4, the indicator rod (14) is held in a horizontal position, but the actual position may vary so long as the locking piece (19) prevents the indicator rod 14's natural tendency of rotation. The axes 16, 18, and 20 are installed on the housing (6). Other variations are possible.

What is claimed is:

1. A self-resetting mechanical short circuit fault indicator comprising a magnetically sensitive core assembly, a rotatable dial block, a locking piece, an indicating rod, and a housing enclosing such; wherein the magnetically sensitive core assembly further comprises a clip-on core, a fixed core, a connection core and a movable core carrying the rotatable dial block, the fixed core and the connection core affixed in the housing; wherein the locking piece is rotatably installed in the housing around a lock axis of rotation, and the indicating rod is rotatably installed in the housing around a pointer axis; and wherein a tension spring is placed between the movable core and the housing, and a compression spring is placed at the fixed core.

2. The self-resetting mechanical short circuit fault indicator of claim 1, wherein the clip-on core comprises two symmetry components and the clip-on core further includes a hinge and a locking spring.

3. The self-resetting mechanical short circuit fault indicator of claim 1, wherein the indicating rod comprises a shaft providing the pointer axis, a pointer connection piece, and an indicating body.

4. The self-resetting mechanical short circuit fault indicator of claim 1, wherein the lock comprises the lock axis of rotation, a lock hook and a weight balancing block.

5. The self-resetting mechanical short circuit fault indicator of claim 1, wherein the housing is made of an electrically insulating material.

\* \* \* \* \*

UNITED STATES PATENT AND TRADEMARK OFFICE
CERTIFICATE OF CORRECTION

PATENT NO. : 9,841,453 B2
APPLICATION NO. : 14/940732
DATED : December 12, 2017
INVENTOR(S) : Shuhai Zhao et al.

It is certified that error appears in the above-identified patent and that said Letters Patent is hereby corrected as shown below:

On the Title Page

The claimed priorities are missing and should be added as follows:
(30) Foreign Application Priority Data
Continuation of PCT/CN2015/071243 filed Jan. 21, 2015, which claims priority to CN Appl. No. 201410308400.9 filed July 1, 2014.

Signed and Sealed this
Twentieth Day of November, 2018

Andrei Iancu
*Director of the United States Patent and Trademark Office*